(12) United States Patent
Parsapour

(10) Patent No.: US 8,164,083 B2
(45) Date of Patent: Apr. 24, 2012

(54) QUANTUM DOT OPTOELECTRONIC DEVICES WITH ENHANCED PERFORMANCE

(75) Inventor: Farzad Parsapour, Bartlett, TN (US)

(73) Assignee: Brother International Corporation, Bridgewater, NJ (US)

( * ) Notice: Subject to any disclaimer, the term of this patent is extended or adjusted under 35 U.S.C. 154(b) by 0 days.

(21) Appl. No.: 12/251,207

(22) Filed: Oct. 14, 2008

(65) Prior Publication Data

US 2010/0090195 A1 Apr. 15, 2010

(51) Int. Cl.
*H01L 29/66* (2006.01)
*H01L 21/28* (2006.01)

(52) U.S. Cl. ......... 257/9; 257/13; 257/14; 257/E29.168; 257/E21.158; 438/22; 438/57

(58) Field of Classification Search .................. 257/9
See application file for complete search history.

(56) References Cited

U.S. PATENT DOCUMENTS

| | | | |
|---|---|---|---|
| 2005/0233487 A1* | 10/2005 | Liu et al. | 438/29 |
| 2007/0077594 A1* | 4/2007 | Hikmet et al. | 435/7.1 |
| 2007/0181898 A1* | 8/2007 | Chik et al. | 257/99 |
| 2007/0182316 A1* | 8/2007 | Mathai et al. | 313/504 |

* cited by examiner

*Primary Examiner* — Zandra Smith
*Assistant Examiner* — Lawrence Tynes, Jr.
(74) *Attorney, Agent, or Firm* — Frommer Lawrence & Haug LLP

(57) ABSTRACT

An optoelectronic device is disclosed which includes a quantum dot layer including plurality of quantum dots which do not have capping layers. This optoelectronic device may be a quantum dot light-emitting device, which includes (1) a substrate which is transparent or translucent, (2) an anode electrical conducting layer which is transparent or translucent, and is located adjacent to the substrate, (3) a planarizing/hole injection layer which is located adjacent to the anode electrical conducting layer, (4) a quantum dot layer including the plurality of quantum dots which do not have capping layers, and (5) a cathode electrical conducting layer which is located adjacent to the quantum dot layer.

19 Claims, 7 Drawing Sheets

QUANTUM DOT OPTOELECTRONIC DEVICES WITH ENHANCED PERFORMANCE

BACKGROUND OF THE INVENTION

1. Field of the Invention

This invention provides for quantum dot optoelectronic devices ("QD-OEDs") having enhanced performance, with a particular focus on quantum dot light-emitting devices ("QD-LEDs") with enhanced performance. However, the benefits of the current invention also apply to quantum dot photovoltaic devices. Compared to the standard QD-OED, the current invention exhibits nominally equal current densities for given applied voltages, a higher internal fluorescence quantum yield (around 8%), increased total light output at equal voltage (around 28%), a lower turn on voltage (around 25%), and a lower operating voltage (around 20%).

The fabrication method for the current invention is similar to the one for the standard device, with one additional step. In particular, a physical surface treatment is performed on the quantum dots ("QDs") prior to deposition of additional charge injection layers or the second electrode. This physical surface treatment modifies the surface of the QDs.

The surface modification of the current invention can be achieved through the utilization of either a low-power oxygen ($O_2$) plasma treatment, or UV-Ozone treatment, following spin-coating the QD layer. This modification entails the removal of the outer organic capping layer which shrouds the QDs. Elimination of this electrically insulating layer results in improved carrier injection from the charge injection layer, or the electrode, to the outermost QD monolayer, or multilayer, adjacent to the electrode. This also results in better charge balance within the device. The afore-mentioned modification and the method of implementation are applicable to a wide range of quantum dots, including size-dependent or composition-dependent QDs of varying sizes and compositions, as well as core, core-shell, alloyed core, and alloyed core-shell quantum dots. The method is also applicable to both light emitting devices and photovoltaic devices for achieving performance enhancement. In the case of a QD photovoltaic device, removal of the capping layer will improve charge transfer to the electrode (reverse process) and the overall charge collection efficiency.

2. Description of Related Art

Semiconductor quantum dots have attracted much attention due to their unique physical, chemical, electrical and optical properties. Much of the interest in optical and electrical characteristics stems from size-dependent properties owing to quantum confinement of charge carriers. This often results in the ability to "tune" the optical spectrum and specifically, both the light absorption and emission responses (perceived color) through changing the size of the QDs. Recently, QDs have been explored for their electroluminescent properties with applications in optoelectronics, particularly, as active emitting layers in planar light emitting devices. Quantum dots have also been studied for use in photovoltaics, specifically as the active layer in solar cells.

Conventional planar light emitting devices such as organic light emitting diodes (OLED) incorporate organic materials as the active emitting layer. This active layer is typically sandwiched between two electrodes, along with other charge injection and charge transport layers. Applying an external electric field through the electrodes results in injection and migration of carriers and formation of electron/hole pairs (excitons) within or at the interface of the active emitting layer, which following radiative recombination, results in emission of (typically) visible light. The color of the emitted light is tuned through changing the composition of the active organic layer or additional filter layers to afford red, green, and blue emission suitable for display or lighting applications.

Planar LED devices that utilize quantum dots, e.g. QD-LEDs, have a structure very similar to traditional OLEDs, with the exception of substitution of inorganic QDs as the active emissive layer in place of the organic materials. Advantages of this methodology include potentially higher material stability, better lifetime and efficiency, as well as increased color saturation, spectral tunability, and relative ease of material preparation. QDs of different sizes, exhibiting different spectral responses, have been prepared and deposited via spin-coating, forming a thin film with a thickness ranging from a single monolayer to several tens of nanometers (nm) within a traditional OLED-type structure. Although these devices to date have not achieved the power efficiencies of their all-organic counterpart, they have exhibited the potential and as such, much effort has been focused on enhancing the characteristics of the QD-LED devices.

Nanostructured solar cells exemplify the novel trend in solar technology research and development, the so-called "Third Generation". This generation of solar cells includes technologies utilizing nanomaterials, polymers, and organic molecules to engineer efficient junctions, provide self-assembly, and form ultra thin films. This provides significant opportunities to achieve low cost, flexibility, high efficiency, and both small and large area implementation. Nanostructured photovoltaics encompass a wide range of technologies including, but not limited to, intermediate bandgap, quantum dot composites, small molecule and polymer organic, and radial junction. Advantages of quantum dot solar cells include high efficiency through multiple carrier generation (resulting in enhanced photocurrent), decreased cost, and relative ease of fabrication. Both stand-alone and polymer/QD hybrid architectures have been reported. Although current QD cells suffer from low efficiencies, the technology appears quite promising and has prompted further investigation.

Typical colloidal quantum dot compositions consist of an active inorganic core (e.g., CdSe or CdS) shrouded by an organic ligand capping layer (e.g., trioctylphosphine oxide ("TOPO")). An alternative colloidal QD composition includes an active inorganic core, encased by an inorganic shell (e.g., ZnS or CdS), which is also shrouded by an organic ligand capping layer. Such a composition is referred to as a "core-shell structure". The inorganic core is solely responsible for emission of light, following either photoexcitation or electrical pumping. In general, core-shell structures possess increased stability and emission quantum yield due to elimination of the core surface defects by the shell moiety. The organic capping layer assists in enhancing the dispersability of the QD composition in various solvents and also acts as a stabilizing agent. As such, it is an integral part of the colloidal system.

However, due to its electrically insulating characteristics, the organic shell can introduce a large barrier to charge injection in electrically pumped solid state systems such as QD-LEDs. Previous efforts have addressed this issue through exchanging the insulating organic ligand (e.g., TOPO) with less insulating organic ligands (e.g., thiols) immediately following the synthesis of colloidal QDs. However, this method has in the past resulted in reduction of emission from the quantum dots due to the exchange procedure and ultimately does not eliminate the organic capping layer and the large barrier to charge injection.

As such, there exists a need for a method and process resulting in elimination of the organic capping layer, post QD deposition.

SUMMARY OF THE INVENTION

In accordance with one embodiment of the invention, an optoelectronic device is disclosed which includes a quantum dot layer including plurality of quantum dots which do not have capping layers.

This optoelectronic device may be a quantum dot light-emitting device, which includes (1) a substrate which is transparent or translucent, (2) an anode electrical conducting layer which is transparent or translucent, and is located adjacent to the substrate, (3) a planarizing/hole injection layer which is located adjacent to the anode electrical conducting layer, (4) a quantum dot layer including the plurality of quantum dots which do not have capping layers, and (5) a cathode electrical conducting layer which is located adjacent to the quantum dot layer.

Pursuant to another embodiment of the invention, a method for constructing an optoelectronic device is disclosed. This method includes multiple steps. First, a quantum dot layer is formed, including a plurality of quantum dots which have capping layers. Next, the capping layers are removed from the quantum dots of the quantum dot layer via a physical surface treatment.

The optoelectronic device of this method may be quantum dot light-emitting device. In addition, the method may further include additional steps. For example, a planarizing/hole injection layer may be formed on a transparent or translucent substrate which has been coated on one side with a transparent or translucent anode conducting layer. In this case, the quantum dot layer is formed, including a plurality of quantum dots which have capping layers, on the planarizing/hole injection layer. Next, the capping layers are removed from the quantum dots of the quantum dot layer via a physical surface treatment. Finally, a cathode electrical conducting layer is formed on the quantum dot layer.

DETAILED DESCRIPTION OF EMBODIMENTS

Figure 1A:
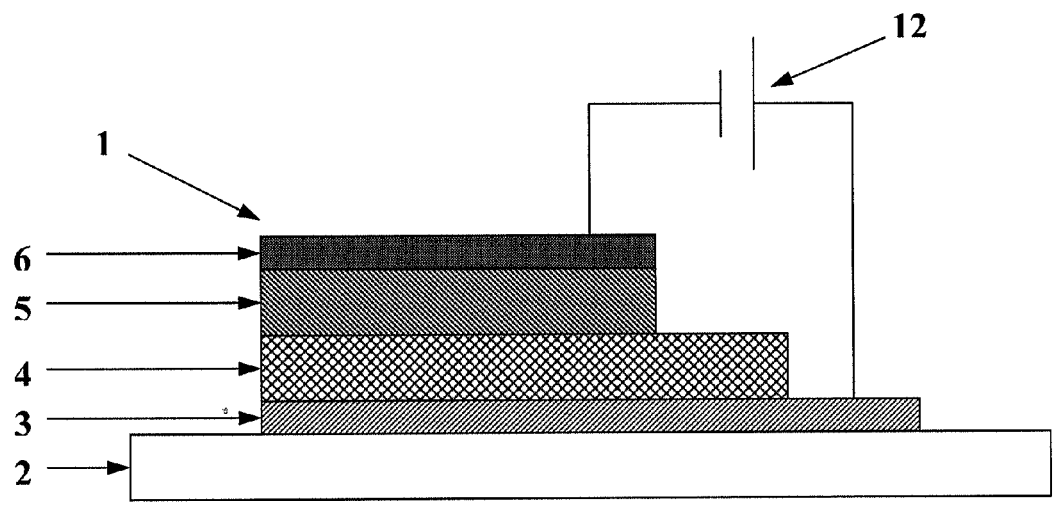
FIGS. 1A-1B illustrate a cross sectional view and a plan view, respectively, of a quantum dot optoelectronic device of one embodiment of the invention.

It is to be understood that the figures and descriptions of the present invention have been simplified to illustrate elements that are relevant for a clear understanding of the present invention, while eliminating, for purposes of clarity, many other elements found in conventional quantum dot optoelectronic device ("QD-OED") fabrication methods. Those of ordinary skill in the art will recognize that other elements are desirable for implementing the present invention. However, because such elements are well known in the art, and because they do not facilitate a better understanding of the present invention, a discussion of such elements is not provided herein.

The present invention will now be described in detail on the basis of exemplary embodiments.

The issue with the organic capping layer, specifically at the interface of the QD layer and the electrode (either cathode or anode, depending on device architecture), stems from the wide gap between its energy levels and energetic mismatch resulting in electrically insulating behavior. These characteristics ultimately result in relatively poor transfer of charges between the QD and the electrode and lower efficiency within the device. Removal of the aforementioned capping layer results in enhanced charge injection to, and transfer from, at least the QD monolayer adjacent to a charge injection layer or the electrode. Therefore, within QD-OEDs, and in particular quantum dot light-emitting devices ("QD-LEDs"), removing the capping layers from the QDs improves the charge balance, resulting in enhanced performance. With regard to QD-LEDs, the enhanced performance is seen in the form of higher light output and lower power consumption. With regard to QD photovoltaic devices, charge transfer from the QD to the electrode is improved, resulting in higher device efficiency. The invention provides a method for removal of the organic capping layer from the quantum dots residing adjacent to a charge injection layer or the electrode.

Within the scope of this invention, capping layer removal is achieved through physical surface alteration by utilizing either an oxygen plasma or UV-Ozone treatment following the deposition of QD layer and prior to deposition of the electrode material. The mechanism by which the removal is achieved may involve disintegration of the organic molecules that form the capping layer through reaction with reactive oxygen species (atoms, radicals, excited ions, etc.). The disintegrated species, generally in gaseous form, escape the surface and render the surface of the QDs free of insulating organic molecules. It is important to note that removal of the capping layers from the QDs prior to deposition as a film and solvent evaporation may decrease stability and promote agglomeration of the QDs, which would be detrimental to the performance of the QDs and either the electroluminescent or the photovoltaic devices. Accordingly, it is recommended to remove the capping layers from the QDs after deposition as a film and solvent evaporation has already taken place.

Figure 1B:
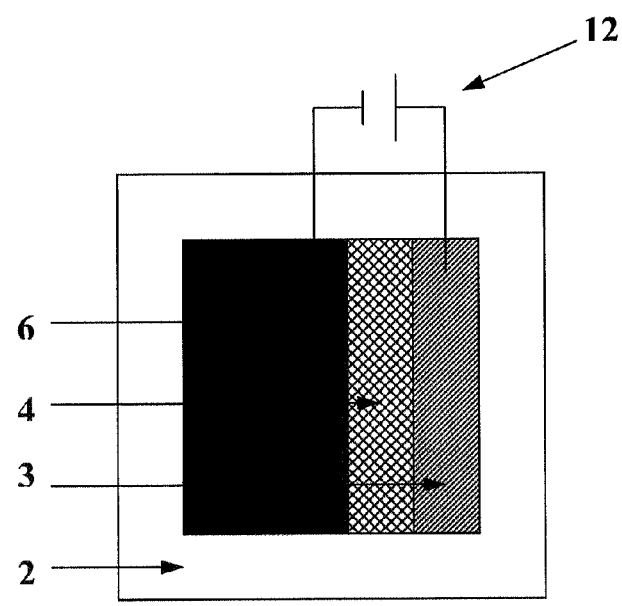

FIG. 1A shows a cross sectional view of one embodiment of the QD-OED 1 of the current invention, and FIG. 1B shows a plan view of the of the QD-OED 1. In this embodiment, the QD-OED is a quantum dot light emitting device ("QD-LED"). The QD-OED 1 includes, a transparent/translucent substrate 2, a transparent/translucent electrical conducting layer 3, a planarizing/hole injection layer 4, a multilayer 5 of quantum dots with their capping layers removed, and an electrical conducting layer 6. The electrical conducting layer 3 acts as an anode, and the electrical conducting layer 6 acts as a cathode. The creation of the QD-LED 1 will now be described in reference to FIGS. 2-5.

Figure 2A:
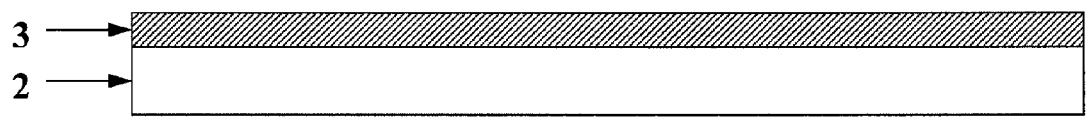
FIGS. 2A-2B illustrate a cross sectional view and a plan view, respectively, of an example of a coated substrate used in one embodiment of the invention.
Figure 2B:
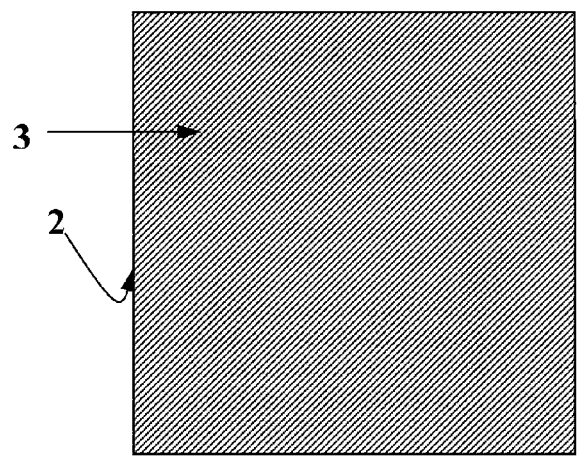

As seen in FIG. 2A, the creation of the QD-LED 1 begins with the clean transparent/translucent substrate 2 which is coated with the transparent/translucent electrical conducting layer 3. For example, the transparent/translucent substrate 2 may be glass, quartz, PET, and other transparent plastic, and the transparent/translucent conducting layer 3 may be indium tin oxide ("ITO"), fluorine-doped tin oxide, doped zinc oxide, carbon nanotubes, and conducting polymers. FIG. 2B depicts a plan view of the coated substrate 2. In FIG. 2B, the substrate 2 is not visible, but is rather located underneath the electrical conducting layer 3, as indicated by the curved arrow.

As seen in FIGS. 3A-D, a planarizing/hole injection layer 4 is formed on the electrical conducting layer 3 via spin-coating. The purpose of the planarizing/hole injection layer 4 is two fold. First, the electrical conducting layer 3 is generally somewhat rough, and the planarizing/hole injection layer 4 creates a smooth, planarized surface on which QDs may then be formed. Second, the planarizing/hole injection layer 4 assists in the transport of the electrical charges from the electrical conducting layer 3 to the multilayer 5 of QDs. This planarizing/hole injection layer 4 can be made of, for example, poly(3,4-ethylenedioxythiophene)-poly(styrenesulfonate) ("PEDOT:PSS"), as well as polyaniline and other conducting polymers with high transparency and good film-forming properties.

Figure 3A:
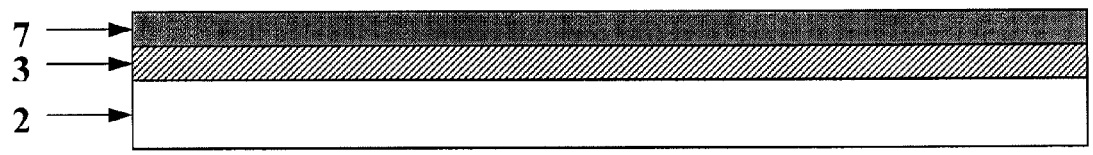
FIGS. 3A-3D illustrate steps in part of one embodiment of a process for the formation a QD-LED of this invention.
Figure 3B:
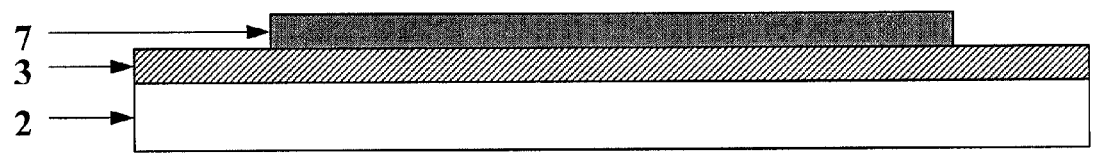
Figure 3C:
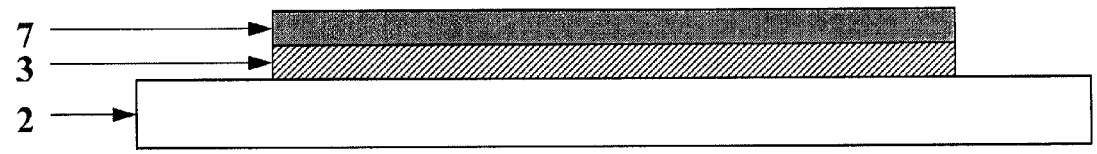
Figure 3D:
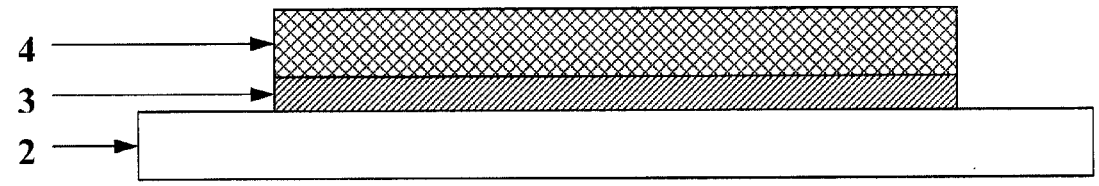

As seen in FIG. 3A, the planarizing/hole injection layer 4 is applied by first coating the electrical conducting layer 3 with a photoresist 7. The photoresist 7 may be applied via spin coating. Once the photoresist 7 is applied, it is covered with a mask so that only a portion of the photoresist 7 is exposed. The masked substrate 2 is then exposed to UV radiation. The substrate 2 is then removed from the mask, chemically developed, and rinsed with water. As seen in FIG. 3B, this removes the portion of the photoresist which was exposed to the UV radiation (i.e., the portion not covered by the mask). Next, as seen in FIG. 3C-D, the substrate 2 is placed in an etching bath so as to remove the areas of the electrical conducing layer 3 which are no longer protected by the photoresist 7. The remaining photoresist 7 is then removed from the substrate 2, and, in its place, the planarizing/hole injection layer 4 is spin coated onto the electrical conducting layer 3.

Figure 4A:
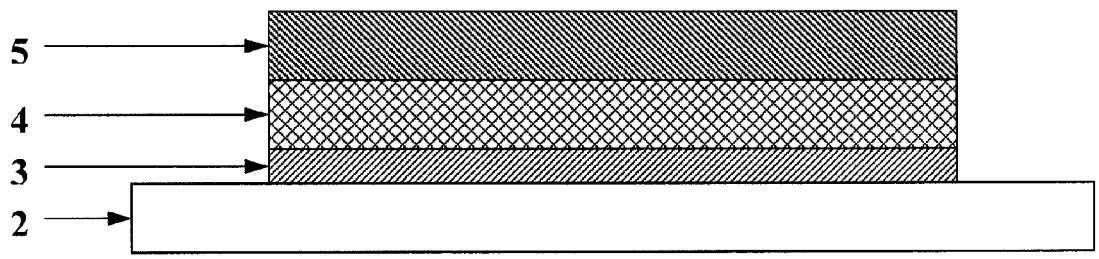
FIGS. 4A-4B illustrate steps in part of one embodiment of a process for the formation a QD-LED of this invention.
Figure 4B:
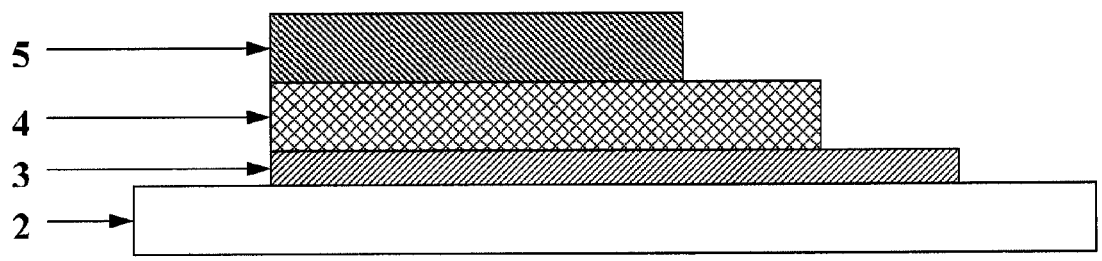

Next, as seen in FIG. 4A, a liquid dispersion of quantum dots ("QDs") is spin coated onto the planarizing/hole injection layer 4 to form a multilayer 5 of QDs. The QD multilayer 5 is then dried. Any solvent used in the liquid dispersion of QDs which has a sufficiently low boiling point will dry during the spin coating process. As seen in FIG. 4B, once the QD multilayer 5 is dried, portions of the planarizing/hole injection layer 4 and the QD multilayer 5 are then wiped away to expose the bare conducting layer 3.

Figure 5:
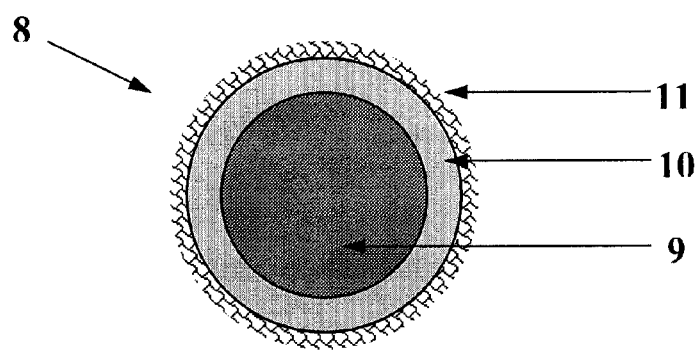
FIG. 5 illustrates the structure of a single quantum dot of the type used in one embodiment of this invention.

It is at this stage that the capping layers for the QDs are removed. FIG. 5 depicts a single QD 8 before its capping layer is removed. As seen in FIG. 5, each QD 8 has a core 9 surrounded by a shell 10, which in turn is surrounded by an organic capping layer 11. While the current embodiment discusses QDs 8 which have shell 10, the invention is not limited thereto. For example, the shell 10 may be absent from the QD 8 so that the capping layer 11 directly surrounds the core 9. The capping layer 11 is removed from the QDs 8 by means of a physical surface treatment. Examples of such a physical surface treatment include oxygen plasma treatment as well as UV-Ozone treatment.

Figure 6A:
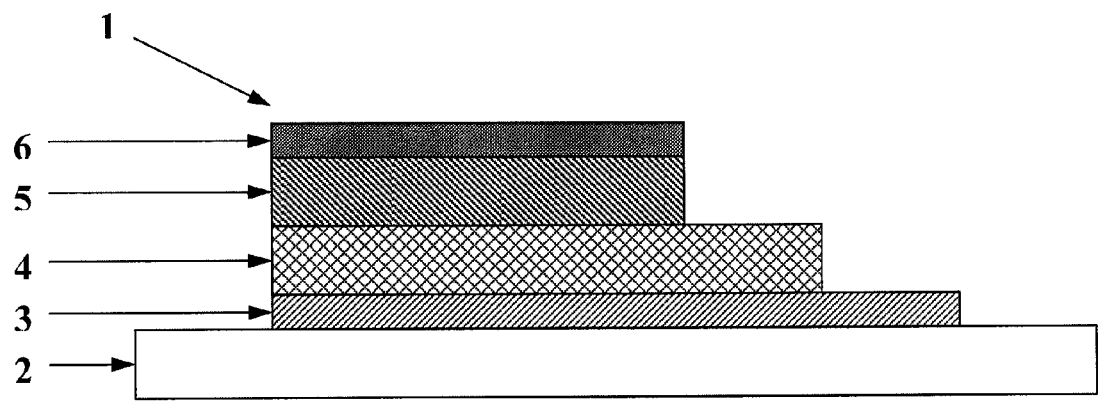
FIGS. 6A-6B illustrate steps in part of one embodiment of a process for the formation a QD-LED of this invention.
Figure 6B:
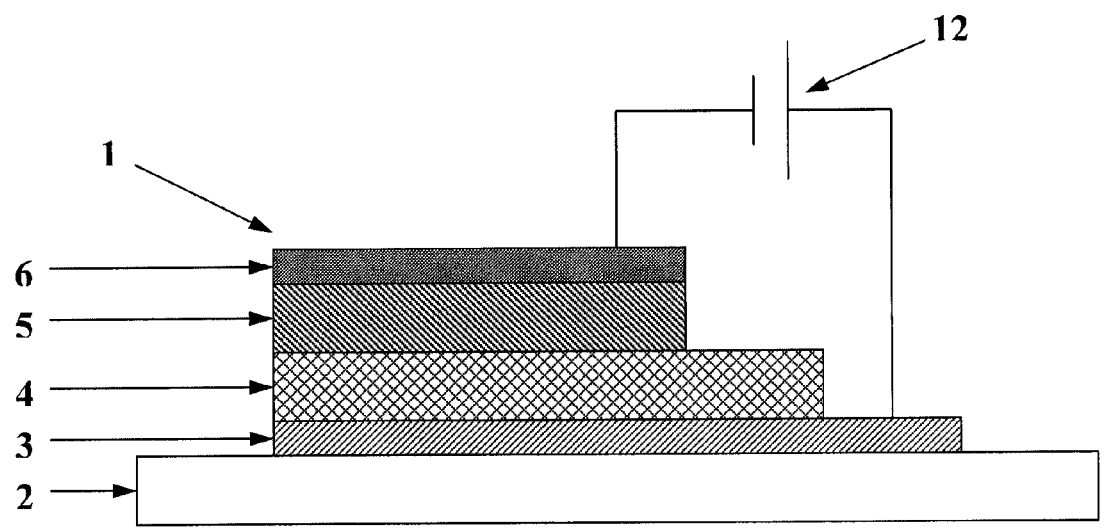

As seen in FIG. 6A, once the capping layers 11 have been removed from the QDs 8 of the QD multilayer 5, an electrical conducting layer 6 is deposited onto the QD multilayer 5. The electrical conducting layer 6 may be made from a metal, such as, for example aluminum, magnesium, magnesium/silver alloy, calcium, and other low-work function metals and conductors. Finally, as seen in FIG. 6B, the finished QD-LED 1 is then connected to a power supply 12. In particular, the electrical conducting layer 6 (which acts as a cathode) and the electrical conducting layer 3 (which acts as an anode) are both connected to the power supply 12, so as to create a circuit.

EXAMPLE 1

To fabricate a QD-LED for Example 1 with quantum dots which have their capping layers removed, a previously cleaned indium tin oxide ("ITO") coated glass substrate (purchased from Delta Technologies) with surface resistance of 4-100 ohms/square, preferably around 70 ohms/square, is baked at 150° C. for 1-2 hours, preferably 1.5 hours, and cooled to room temperature. A positive photoresist (PR-1000A purchased from Futurrex, Inc.) is deposited on the surface of the ITO via spin coating to afford a layer approximately 1 micron thick. The photoresist layer is then baked at 100° C. for 10 minutes, after which it is cooled to room temperature. Once it has reached room temperature, the substrate is inserted into a mask aligner (TAMARAC) and masked.

A pattern with around a 1.2 $cm^2$ area is formed in the photoresist layer by (1) exposing the masked substrate to UV radiation, then (2) developing the photoresist layer in a basic solution (Futurrex RD-1), and finally (3) rinsing the photoresist layer with purified water. The substrate is then air-dried and hard-baked at 150° C. for 30 minutes. This produces a substrate where areas of the photoresist layer have been removed so as form a photoresist mask layer. As such, portions of ITO are exposed in the areas of the substrate not covered by the mask layer.

After baking, the substrate is then cooled to room temperature and inserted in an ITO etch bath containing $HCl:H_2O$:HNO3 (4:2:1 ratio by volume), so as to remove ITO from areas not covered by the photoresist mask layer. After rinsing with water and drying with pressurized air, the photoresist mask layer is then removed from the ITO/glass substrate. This is accomplished by agitating the substrate in a remover solution (Futurrex RR-4), followed by rinsing the substrate in water, thereby affording a rectangular pattern of around 1.2 $cm^2$ of ITO on top of the glass substrate.

The ITO-patterned substrate is then subjected to UV-Ozone cleaning procedure to remove residual organics, and increase the surface free energy and the work function of the ITO layer. Afterwards, a ~50 nm-thick layer of poly(3,4-ethylenedioxythiophene)-poly(styrenesulfonate) ("PEDOT:PSS") from a water dispersion (Baytron® P VP AI 4083, 1.5 wt % from H. C. Stark) is formed via spin-coating of the afore-mentioned patterned substrate. The substrate is then baked at 200° C. for 10 minutes to remove residual water.

Following cooling to room temperature, a dispersion of CdSe/ZnS quantum dots capped with trioctylphosphine oxide ("TOPO") in chloroform (~6 nm QD diameter, purchased from Evident Technologies), at 1-8 mg/ml total QD content (preferably around 5 mg/ml total QD content), is dispensed onto the substrate. The substrate is then spin coated at 3000 RPM for 60 seconds to afford a ~20 nm-thick QD multilayer. A small area of the ITO/PEDOT:PSS/QD adjacent to the edge of the substrate is wiped cleaned of both the PEDOT:PSS and the QDs so as to expose the bare ITO for future electrical connection.

Following the deposition of the QD layer and removal of a portion of layers to expose the bare ITO for electrical connection, the layered substrate is placed in a parallel-plate RF plasma apparatus' chamber and the chamber is evacuated down to a pressure of around 10 mTorr. Then, oxygen is introduced into the chamber through a mass flow controller at a rate of 20-50 sccm, preferably 25 sccm, and the chamber pressure is stabilized to 100-200 mTorr (preferably 150 mTorr). A power density in the range of 0.6-3 mW/cm$^3$ (preferably 1.4 mW/cm$^3$) is applied to generate the oxygen plasma. The oxygen plasma treatment time is 60-240 seconds (preferably 90 seconds).

While the above Example 1 utilizes an oxygen plasma treatment to remove the capping layers from the QDs, the current invention is not limited thereto. For example, the capping layers may also be removed via a UV-Ozone treatment, utilizing a UV-Ozone apparatus in place of the plasma apparatus. For the UV-Ozone treatment, 28 mW/cm$^2$ at 254 nm emission of a low pressure Mercury lamp is applied. Sample distance to the lamp grid is in the range of 0.5 mm-6 mm, preferably 1 mm, and the treatment time is in the range of 30 seconds to 300 seconds, preferably 90 seconds.

The substrate is then masked in such manner to afford an approximately 0.56 cm$^2$ active area, following metal cathode deposition. Next, the substrate is placed in an e-beam evaporator where a 100 nm thick layer of aluminum (Al) cathode material is deposited on the top layer (QD layer) at a rate of 0.2 nm/s and an operating vacuum level of 1.0E-6 Torr. Following the cathode deposition, the substrate is removed from the evaporator and two parallel silver bus bars are formed on either electrode (ITO and Al) to facilitate electrical contact.

The finished device is connected to a power supply, voltage is applied, and electrical and optical characteristics of the device are measured. Optical properties are measured utilizing both a luminance meter and a spectrofluorometer.

COMPARATIVE EXAMPLE 1

To fabricate a QD-LED for Comparative Example 1 with quantum dots which still have their capping layers, a previously cleaned indium tin oxide ("ITO") coated glass substrate (purchased from Delta Technologies) with surface resistance of 4-100 ohms/square, preferably around 70 ohms/square, is baked at 150° C. for 1-2 hours, preferably 1.5 hours, and cooled to room temperature. A positive photoresist (PR-1000A purchased from Futurrex, Inc.) is deposited on the surface of the ITO via spin coating to afford a layer approximately 1 micron thick. The photoresist layer is then baked at 100° C. for 10 minutes, after which it is cooled to room temperature. Once it has reached room temperature, the substrate is inserted into a mask aligner (TAMARAC) and masked.

A pattern with around a 1.2 cm$^2$ area is formed in the photoresist layer by (1) exposing the masked substrate to UV radiation, then (2) developing the photoresist layer in a basic solution (Futurrex RD-1), and finally (3) rinsing the photoresist layer with purified water. The substrate is then air-dried and hard-baked at 150° C. for 30 minutes. This produces a substrate where areas of the photoresist layer have been removed so as form a photoresist mask layer. As such, portions of ITO are exposed in the areas of the substrate not covered by the mask layer.

After baking, the substrate is then cooled to room temperature and inserted in an ITO etch bath containing HCl:H$_2$O:HNO3 (4:2:1 ratio by volume), so as to remove ITO from areas not covered by the photoresist mask layer. After rinsing with water and drying with pressurized air, the photoresist mask layer is then removed from the ITO/glass substrate. This is accomplished by agitating the substrate in a remover solution (Futurrex RR-4), followed by rinsing the substrate in water, thereby affording a rectangular pattern of around 1.2 cm$^2$ of ITO on top of the glass substrate.

The ITO-patterned substrate is then subjected to UV-Ozone cleaning procedure to remove residual organics, and increase the surface free energy and the work function of the ITO layer. Afterwards, a ~50 nm-thick layer of poly(3,4-ethylenedioxythiophene)-poly(styrenesulfonate) ("PEDOT:PSS") from a water dispersion (Baytron® P VP AI 4083, 1.5 wt % from H. C. Stark) is formed via spin-coating of the afore-mentioned patterned substrate. The substrate is then baked at 200° C. for 10 minutes to remove residual water.

Following cooling to room temperature, a dispersion of CdSe/ZnS quantum dots capped with trioctylphosphine oxide ("TOPO") in chloroform (~6 nm QD diameter, purchased from Evident Technologies), at 1-8 mg/ml total QD content (preferably around 5 mg/ml total QD content), is dispensed onto the substrate. The substrate is then spin coated at 3000 RPM for 60 seconds to afford a ~20 nm-thick QD multilayer. A small area of the ITO/PEDOT:PSS/QD adjacent to the edge of the substrate is wiped cleaned of both the PEDOT:PSS and the QDs so as to expose the bare ITO for future electrical connection.

The substrate is then masked in such manner to afford an approximately 0.56 cm$^2$ active area, following metal cathode deposition. Next, the substrate is placed in an e-beam evaporator where a 100 nm thick layer of aluminum (Al) cathode material is deposited on the top layer (QD layer) at a rate of 0.2 nm/s and an operating vacuum level of 1.0E-6 Torr. Following the cathode deposition, the substrate is removed from the evaporator and two parallel silver bus bars are formed on either electrode (ITO and Al) to facilitate electrical contact.

The finished device is connected to a power supply, voltage is applied, and electrical and optical characteristics of the device are measured. Optical properties are measured utilizing both a luminance meter and a spectrofluorometer.

TABLE I

| Device | $V_{TO}$ | $V_{OP}$ | Normalized Light Output (Equal Voltage) | Fluorescence Quantum Yield (normalized to Comparative Example 1) | Power (Cd/A) Efficiency Enhancement (normalized to Comparative Example 1) |
|---|---|---|---|---|---|
| Example 1 | 3.0 | 8.0 | 1.28 | 1.08 | +28% |
| Comparative Example 1 | 4.0 | 10.0 | 1.00 | 1.00 | — |

Table I summarizes the enhancements observed in the QD-LED of Example 1 compared to that of Comparative Example 1, including an increase of around 28% in power efficiency. In Table I, $V_{TO}$ is the turn-on voltage (i.e., the voltage at which lights can actually be seen coming out of the QD-LED) and $V_{OP}$ is the operating voltage (i.e., the voltage at which the QD-LED must be run to operate at the level corresponding to the desired current density). The lower the turn-on voltage, the more efficient the QD-LED operates. As such, a lower turn-on voltage is desired. Similarly, the lower the operating voltage, the more efficiently the QD-LED operates. As such, a lower operating voltage is desired.

As can be seen in Table I, the QD-LED of Example 1 shows a higher internal fluorescence quantum yield (around 8%), increased total light output at equal voltage (around 28%), a lower turn on voltage (around 25%), and a lower operating voltage (around 20%) when compared with the QD-LED of Comparative Example 1.

Figure 7:
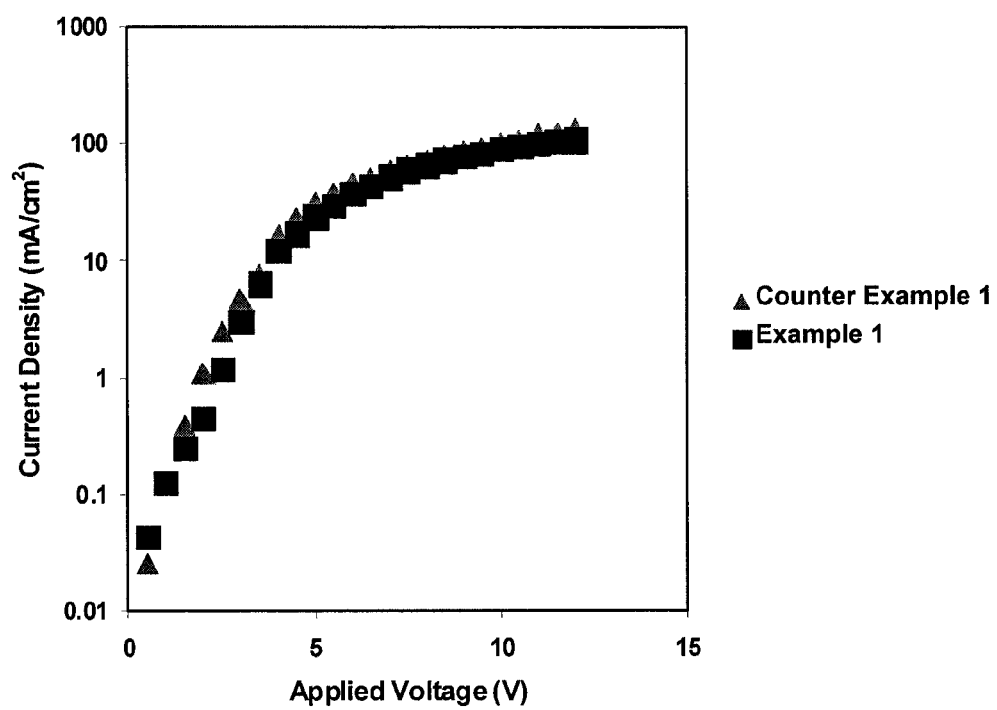
FIG. 7 exhibits a comparison between the current density vs. voltage plot for the QD-LED of Example 1 to that for the QD-LED of Comparative Example 1.

FIG. 7 exhibits a comparison between the current density vs. voltage plot for the QD-LED of Example 1 to that for the QD-LED of Comparative Example 1.

Figure 8:
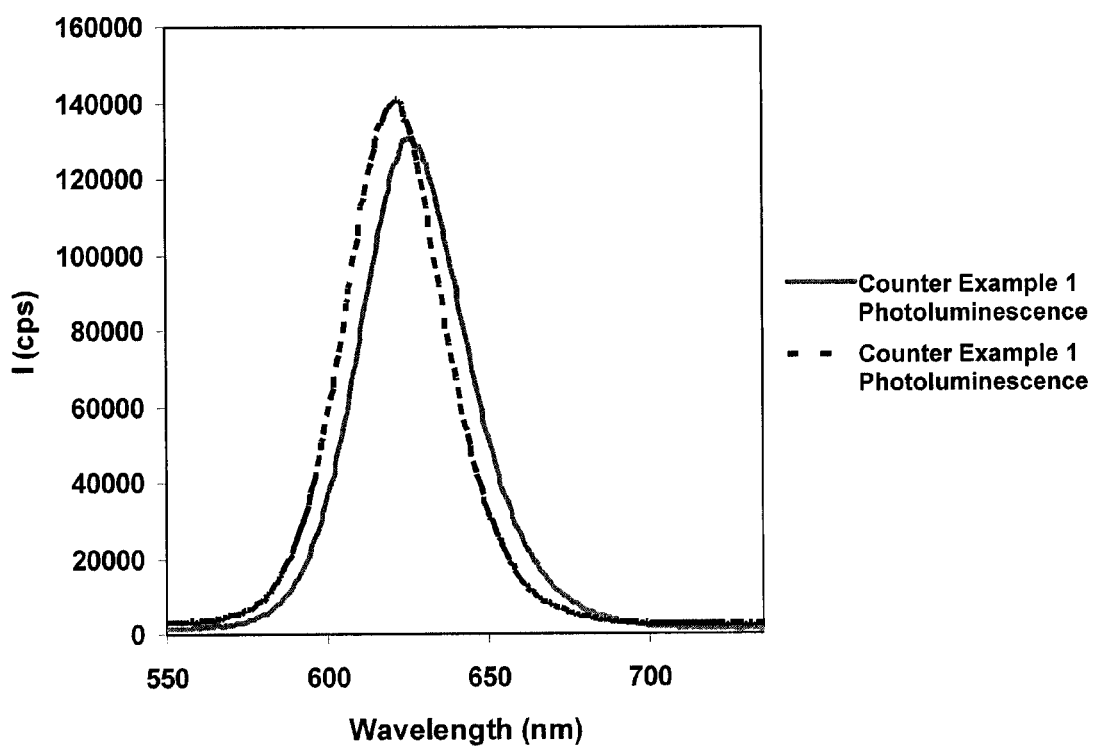
FIG. 8 exhibits a comparison between the photoluminescence of the QD-LED of Example 1 and that of the QD-LED of Comparative Example 1.

FIG. 8 exhibits a comparison between the photoluminescence of the QD-LED of Example 1 and that of the QD-LED of Comparative Example 1. Samples were illuminated at 400 nm. A 5 nm spectral shift is apparent, probably due to a change in QD energetics related to the removal of the organic capping layer. Also, an increase in total photoluminescence is observed.

While this invention has been described in conjunction with the specific embodiments outlined above, it is evident that many alternatives, modifications, and variations will be apparent to those skilled in the art. Accordingly, the preferred embodiments of the invention as set forth above are intended to be illustrative, not limiting. Various changes may be made without departing from the spirit and scope of the inventions as defined in the following claims.

What is claimed is:

1. An optoelectronic device comprising:
    a plurality of quantum dots, each of which has a core but does not have a shell or an organic capping layer;
    wherein the plurality of quantum dots are arranged to form a quantum dot layer, such that surfaces of some of the cores of the quantum dots directly contact surfaces of others of the cores of the quantum dots.

2. The optoelectronic device of claim 1;
    wherein the optoelectronic device is a quantum dot light-emitting device, the quantum dot light-emitting device comprising:
        a substrate which is transparent or translucent;
        an anode electrical conducting layer which is transparent or translucent, and is located adjacent to the substrate;
        a planarizing/hole injection layer which is located adjacent to the anode electrical conducting layer;
        a quantum dot layer including the plurality of quantum dots which do not have capping layers; and
        a cathode electrical conducting layer which is located adjacent to the quantum dot layer.

3. The optoelectronic device of claim 2;
    wherein the substrate includes glass.

4. The optoelectronic device of claim 2;
    wherein the anode electrical conducting layer includes indium tin oxide.

5. The optoelectronic device of claim 2;
    wherein the planarizing/hole injection layer includes poly(3,4-ethylenedioxythiophene)-poly(styrenesulfonate).

6. The optoelectronic device of claim 2;
    wherein the cathode electrical conducting layer includes aluminum.

7. The optoelectronic device of claim 1;
    wherein the optoelectronic device is a photovoltaic device.

8. A method for constructing an optoelectronic device, the method comprising:
    forming a quantum dot layer, including a plurality of quantum dots which have capping layers; and
    removing the capping layers from the quantum dots of the quantum dot layer via a physical surface treatment.

9. The method of claim 8;
    wherein the optoelectronic device is a quantum dot light-emitting device, and the method further comprised:
        forming a planarizing/hole injection layer on a transparent or translucent substrate which has been coated on one side with a transparent or translucent anode conducting layer;
        forming the quantum dot layer, including a plurality of quantum dots which have capping layers, on the planarizing/hole injection layer;
        removing the capping layers from the quantum dots of the quantum dot layer via a physical surface treatment; and
        forming a cathode electrical conducting layer on the quantum dot layer.

10. The method of claim 9;
    wherein the physical surface treatment is an oxygen plasma treatment.

11. The method of claim 9;
    wherein the physical surface treatment is a UV-Ozone treatment.

12. The method of claim 9;
    wherein the substrate is glass.

13. The method of claim 9;
    wherein the anode electrical conducting layer includes indium tin oxide.

14. The method of claim 9;
    wherein the planarizing/hole injection layer includes poly(3,4-ethylenedioxythiophene)-poly(styrenesulfonate).

15. The method of claim 9;
    wherein the cathode electrical conducting layer includes aluminum.

16. The method of claim 8;
    wherein the optoelectronic device is a photovoltaic device.

17. An optoelectronic device comprising:
    a plurality of quantum dots, each of which has a core and a shell but does not have an organic capping layer;
    wherein the plurality of quantum dots are arranged to form a quantum dot layer, such that surfaces of some of the shells of the quantum dots directly contact surfaces of others of the shells of the quantum dots.

18. The optoelectronic device of claim 17;
    wherein the optoelectronic device is a quantum dot light-emitting device, the quantum dot light-emitting device comprising:
        a substrate which is transparent or translucent;
        an anode electrical conducting layer which is transparent or translucent, and is located adjacent to the substrate;
        a planarizing/hole injection layer which is located adjacent to the anode electrical conducting layer;
        a quantum dot layer including the plurality of quantum dots which do not have capping layers; and
        a cathode electrical conducting layer which is located adjacent to the quantum dot layer.

19. The optoelectronic device of claim 17;
    wherein the optoelectronic device is a photovoltaic device.

* * * * *